(12) United States Patent
Kanematsu et al.

(10) Patent No.: US 10,690,716 B2
(45) Date of Patent: Jun. 23, 2020

(54) MULTILAYER WIRING BOARD FOR INSPECTION OF ELECTRONIC COMPONENTS

(71) Applicant: NGK SPARK PLUG CO., LTD., Nagoya-shi, Aichi (JP)

(72) Inventors: Junichirou Kanematsu, Kounan (JP); Kenji Suzuki, Ichinomiya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 56 days.

(21) Appl. No.: 16/309,066

(22) PCT Filed: May 8, 2017

(86) PCT No.: PCT/JP2017/017413
§ 371 (c)(1),
(2) Date: Dec. 11, 2018

(87) PCT Pub. No.: WO2017/217138
PCT Pub. Date: Dec. 21, 2017

(65) Prior Publication Data
US 2019/0162778 A1    May 30, 2019

(30) Foreign Application Priority Data
Jun. 17, 2016 (JP) .................. 2016-120359

(51) Int. Cl.
*G01R 31/28* (2006.01)
*H05K 3/46* (2006.01)
(Continued)

(52) U.S. Cl.
CPC ..... *G01R 31/2884* (2013.01); *G01R 31/2886* (2013.01); *H01L 23/12* (2013.01);
(Continued)

(58) Field of Classification Search
CPC ............ G01R 31/2884; G01R 31/2886; G01R 1/07378; H05K 3/46; H05K 3/4632;
(Continued)

(56) References Cited

U.S. PATENT DOCUMENTS 5,375,042 A * 12/1994 Arima ..................... H01L 23/10
174/255
7,679,386 B2 * 3/2010 Murata .............. G01R 1/07314
324/754.07
(Continued)

FOREIGN PATENT DOCUMENTS

JP    2015-002226 A    1/2015

OTHER PUBLICATIONS

European Patent Office, Extended European Search Report issued in corresponding Application No. EP 17813043.1, dated Jan. 14, 2020.
(Continued)

*Primary Examiner* — Lee E Rodak
(74) *Attorney, Agent, or Firm* — Stites & Harbison, PLLC; Jeffrey A. Haeberlin

(57) ABSTRACT

Provided is a multilayer wiring board for inspection of electronic components which has excellent reliability by improving the adhesiveness between a resin wiring portion and a ceramic wiring substrate. A multilayer wiring board 10 according to the present invention includes: a ceramic wiring substrate 20 having a substrate main surface 21 and a substrate rear surface 22; substrate-side conductive layers 32, 33 formed on the substrate main surface 21; and a resin wiring portion 40 stacked on the substrate main surface 21 so as to cover the substrate-side conductive layers 32, 33. Inspection pads 50, 51 for inspection of electronic components are formed on a front surface 49 of the resin wiring portion 40. End surfaces of the substrate-side conductive layers 33 are exposed from side surfaces 13 of the multilayer (Continued)

wiring board 10. An outer peripheral edge of a rear surface of the resin wiring portion 40 is in contact with the surfaces of the substrate-side conductive layers 33, and end surfaces of the resin wiring portion 40 and the end surfaces of the substrate-side conductive layers 33 are positioned closer to the center of the board than end surfaces 23 of the ceramic wiring substrate 20.

8 Claims, 5 Drawing Sheets

(51) Int. Cl.
    *H05K 3/00*     (2006.01)
    *H05K 3/06*     (2006.01)
    *H05K 1/03*     (2006.01)
    *H01L 23/12*     (2006.01)

(52) U.S. Cl.
    CPC ........... *H05K 1/036* (2013.01); *H05K 3/0038* (2013.01); *H05K 3/064* (2013.01); *H05K 3/46* (2013.01); *H05K 3/4632* (2013.01)

(58) Field of Classification Search
    CPC ...... H05K 3/064; H05K 3/0038; H05K 1/036; H05K 2201/0919; H05K 2201/09154; H05K 3/4629; H05K 3/4605; H05K 3/4688; H05K 3/4655; H05K 3/38; H01L 23/12
    See application file for complete search history.

(56) References Cited

U.S. PATENT DOCUMENTS

| | | |
|---|---|---|
| 2004/0264837 A1 | 12/2004 | Ogawa |
| 2015/0173196 A1 | 6/2015 | Choi et al. |
| 2016/0323996 A1* | 11/2016 | Takemura ............ H05K 3/4629 |
| 2017/0146570 A1* | 5/2017 | Takemura ............. H05K 1/036 |

OTHER PUBLICATIONS

Japan Patent Office, International Search Report issued in International Stage Application No. PCT/JP2017/017413, dated Aug. 1, 2017.

\* cited by examiner

MULTILAYER WIRING BOARD FOR INSPECTION OF ELECTRONIC COMPONENTS

TECHNICAL FIELD

The present invention relates to a multilayer wiring board for inspection of electronic components, which includes: a ceramic wiring substrate having a substrate main surface and a substrate rear surface; and a resin wiring portion stacked on the substrate main surface.

BACKGROUND ART

In recent years, semiconductor integrated circuit devices (IC chips) used as, for example, microprocessors of computers have greatly advanced in operation speed and functionality. In association with such advancement, the number of terminals tends to be increased and the pitch between the terminals tends to be narrower. Generally, a large number of terminals are densely arranged in arrays on the bottom surface of an IC chip. Thus, a multilayer wiring board for exclusive usage (for inspection of electronic components) is required at the time of inspection of an electronic component such as an IC chip.

As the multilayer wiring board for inspection of electronic components, a multilayer wiring board in which a resin wiring portion obtained by stacking a plurality of resin insulation layers is stacked on the upper layer side of a ceramic wiring substrate obtained by stacking a plurality of ceramic insulation layers, is practically used (e.g., refer to Patent Document 1). This multilayer wiring board is manufactured by arranging the plurality of resin insulation layers on the ceramic wiring substrate, and heating and pressing the resultant structure so that the resin wiring portion formed of the resin insulation layers is pressure-bonded to the ceramic wiring substrate.

PRIOR ART DOCUMENT

Patent Document

Patent Document 1: Japanese Patent Application Laid-Open (kokai) No. 2015-2226 (FIG. 1, etc.)

SUMMARY OF THE INVENTION

Problem to be Solved by the Invention

Incidentally, in the multilayer wiring board disclosed in Patent Document 1, an outer periphery portion of a rear surface of the resin wiring portion (lowermost resin insulation layer) is in direct contact with the ceramic insulation layer of the ceramic wiring substrate. However, since the adhesiveness between the resin insulation layer and the ceramic insulation layer is relatively low, there is a risk that delamination occurs between the resin wiring portion and the ceramic wiring substrate. As a result, a problem arises that a manufactured multilayer wiring board becomes a defective product so that the reliability of the multilayer wiring board is reduced.

The present invention has been conceived of in view of the above-described problem, and an object of the invention is to provide a multilayer wiring board for inspection of electronic components which has excellent reliability by improving the adhesiveness between the resin wiring portion and the ceramic wiring substrate.

Means for Solving the Problem

Means (means 1) for solving the above-described problem is a multilayer wiring board for inspection of electronic components, the multilayer wiring board including: a ceramic wiring substrate having a substrate main surface and a substrate rear surface and having a structure in which a plurality of ceramic insulation layers are stacked; substrate-side conductive layers formed on the substrate main surface; a resin wiring portion stacked on the substrate main surface so as to cover the substrate-side conductive layers and having a structure in which a plurality of resin insulation layers are stacked; and a plurality of inspection pads, for inspection of electronic components, formed on a front surface of the resin wiring portion. End surfaces of the substrate-side conductive layers are exposed from side surfaces of the multilayer wiring board, an outer peripheral edge of a rear surface of the resin wiring portion is in contact with surfaces of the substrate-side conductive layers, and end surfaces of the resin wiring portion and the end surfaces of the substrate-side conductive layers are positioned closer to a center of the board than end surfaces of the ceramic wiring substrate.

Thus, in the invention according to means 1, the end surfaces of the substrate-side conductive layers are exposed from the side surfaces of the multilayer wiring board, and the outer peripheral edge of the rear surface of the resin wiring portion is in contact with the surfaces of the substrate-side conductive layers. Thus, an outer periphery portion of the rear surface of the resin wiring portion (lowermost resin insulation layer) is not in direct contact with the ceramic insulation layer of the ceramic wiring substrate, but is in contact with the ceramic insulation layer with the substrate-side conductive layers interposed therebetween. In this case, the adhesiveness between the resin insulation layer and the substrate-side conductive layers is ensured, and the adhesiveness between the substrate-side conductive layers and the ceramic insulation layer is ensured. Thus, delamination is less likely to occur between the resin wiring portion and the ceramic wiring substrate. Accordingly, the resin wiring portion and the ceramic wiring substrate reliably come to be in close contact with each other, whereby a multilayer wiring board for inspection of electronic components which has excellent reliability can be obtained.

Incidentally, the multilayer wiring board for inspection of electronic components is held by a clamp at the time of inspection of an electronic component (refer to FIG. 1). However, since the holding surfaces of the clamp are brought into close contact with the side surfaces of the multilayer wiring board, if the end surfaces of the substrate-side conductive layers are exposed from the side surfaces of the multilayer wiring board, there is a risk that a malfunction (short-circuiting, etc.) due to a current flowing from the substrate-side conductive layers to the clamp occurs. Thus, in the invention according to means 1, the end surfaces of the substrate-side conductive layers are positioned closer to the center of the board than the end surfaces of the ceramic wiring substrate. With this configuration, since the end surfaces of the substrate-side conductive layers are spaced apart from the holding surfaces of the clamp, even if the end surfaces of the substrate-side conductive layers are exposed from the side surfaces of the multilayer wiring board, the substrate-side conductive layers and the clamp are prevented from being electrically connected to each other. Thus, any malfunction due to a current flowing from the substrate-side conductive layers to the clamp can be prevented. It is noted that a state where "the end surfaces of the substrate-side conductive layers are exposed" refers to a state where the end surfaces of outer-periphery-side conductive layers can be visually recognized when the multilayer wiring board is laterally viewed.

The above-described multilayer wiring board includes: the ceramic wiring substrate; the substrate-side conductive layers formed on the substrate main surface of the ceramic wiring substrate; and the resin wiring portion stacked on the substrate main surface so as to cover the substrate-side conductive layers. The ceramic wiring substrate has a structure in which the plurality of ceramic insulation layers are stacked, and the resin wiring portion has a structure in which the plurality of resin insulation layers are stacked. Here, sintered bodies of high-temperature fired ceramic such as alumina, aluminum nitride, boron nitride, silicon carbide, or silicon nitride are preferably used as the ceramic insulation layers. In addition, sintered bodies of low-temperature fired ceramic such as a glass ceramic obtained by adding an inorganic ceramic filler such as alumina to borosilicate-based glass or lead borosilicate-based glass may be used as the ceramic insulation layers. Furthermore, sintered bodies of dielectric ceramic such as barium titanate, lead titanate, or strontium titanate may be used as the ceramic insulation layers depending on purposes.

There is no particular limitation regarding the substrate-side conductive layers. However, in a case where the substrate-side conductive layers and the ceramic insulation layers are formed by a co-firing method, metal powder in the conductors needs to have a higher melting point than the temperature at which the ceramic insulation layers are fired. For example, in a case where the ceramic insulation layers are made from so-called high-temperature fired ceramic (e.g., alumina), nickel (Ni), tungsten (W), molybdenum (Mo), manganese (Mn), or the like, or an alloy of those may be selected as the metal powder in the conductors. In a case where the ceramic insulation layers are made from so-called low-temperature fired ceramic (e.g., glass ceramic), copper (Cu), silver (Ag), or the like, or an alloy of those may be selected as the metal powder in the conductors.

For forming the resin insulation layers, although a polyimide-based resin material is generally used, a resin other than a polyimide-based resin may be used, and selection may be appropriately performed considering insulation property, heat resistance, humidity resistance, and the like. In addition, examples of the material that may be used for the resin insulation layers include: a composite material obtained by combining a resin and an organic fiber such as a polyamide fiber or a glass fiber (glass woven fabric or glass nonwoven fabric); and a resin-resin composite material obtained by impregnating a three-dimensional net-like fluororesin base material such as a continuous porous PTFE with a thermosetting resin.

The resin wiring portion preferably has wiring layers between the plurality of resin insulation layers. With this configuration, an electric circuit can be formed in the resin wiring portion, and thus, the performance of the multilayer wiring board can be enhanced. The wiring layers are made mainly from copper, and are formed by a known technique such as a subtractive technique, a semi-additive technique, or a full-additive technique. Specifically, a technique such as etching of a copper foil, electroless copper plating, or electrolytic copper plating is used. Alternatively, the wiring layers may be formed by performing etching after a thin film is formed by a technique such as sputtering or CVD, or the wiring layers may be formed by printing an electrically conductive paste or the like.

It is preferable that chamfered portions are formed at boundary portions between the front surface of the resin wiring portion and the side surfaces of the multilayer wiring board, and the end surfaces of the substrate-side conductive layers and entireties of the end surfaces of the resin wiring portion are exposed from surfaces of the chamfered portions. With this configuration, at the time of inspection of an electronic component, since the surfaces of the chamfered portions are spaced apart from the holding surfaces of the clamp holding the multilayer wiring board, even if the end surfaces of the substrate-side conductive layers are exposed from the surfaces of the chamfered portions, the substrate-side conductive layers and the clamp are prevented from being electrically connected to each other. Thus, any malfunction (short-circuiting, etc.) due to a current flowing from the substrate-side conductive layers to the clamp can be prevented.

The substrate-side conductive layers exposed from the side surfaces of the multilayer wiring board are preferably electrically connected to the inspection pads. That is, the substrate-side conductive layers are preferably not dummy conductors that are not electrically connected to the inspection pads. If the substrate-side conductive layers are dummy conductors, there is a risk that the problem to be addressed by the present invention that "a malfunction (short-circuiting, etc.) due to a current flowing from the substrate-side conductive layers to the clamp occurs" does not arise in the first place.

In addition, it is preferable that the chamfered portions are formed also at boundary portions between the substrate main surface and the end surfaces of the ceramic wiring substrate, and parts of the end surfaces of the ceramic wiring substrate are exposed from the surfaces of the chamfered portions. With this configuration, since the chamfered portions are provided, even if stress is applied to the ceramic wiring substrate, the stress concentration on the boundary portions between the substrate main surface and the end surfaces of the ceramic wiring substrate is reduced. As a result, a problem that the ceramic at the above-described boundary portions is chipped can be avoided, whereby the reliability of the multilayer wiring board for inspection of electronic components is improved.

Furthermore, the surfaces of the chamfered portions and the end surfaces of the substrate-side conductive layers are preferably substantially flush with each other. With this configuration, the end surfaces of the substrate-side conductive layers and the holding surfaces of the clamp are more reliably prevented from coming into contact with each other, and thus, any malfunction due to a current flowing from the substrate-side conductive layers to the clamp can be more reliably prevented. It is noted that a state where "the surfaces of the chamfered portions and the end surfaces of the substrate-side conductive layers are substantially flush with each other" refers to a state where the amount of projection of each of the substrate-side conductive layers from the surface of the corresponding one of the chamfered portions is not smaller than −5 µm but not larger than 5 µm. In addition, the end surfaces of the substrate-side conductive layers may be positioned closer to an outer periphery portion of the board than the surfaces of the chamfered portions, or may be positioned closer to a center portion of the board than the surfaces of the chamfered portions.

It is preferable that the resin wiring portion has the wiring layers between the plurality of resin insulation layers, and no end surfaces of the wiring layers are exposed from the surfaces of the chamfered portions. With this configuration, any of the wiring layers of the resin wiring portion is prevented from unintentionally causing short-circuiting with another one of the wiring layers or the substrate-side conductive layers.

The surfaces of the chamfered portions may be flat surfaces, or may be curved surfaces protruding outward of the multilayer wiring board. However, in a case where the chamfered portions are flat surfaces, the chamfered portions can be easily formed with high accuracy as compared with a case where the chamfered portions are curved surfaces. On the other hand, in a case where the surfaces of the chamfered portions are curved surfaces, the surfaces of the chamfered portions have no "corners", and thus, the stress concentration on the boundary portions between the front surface of the resin wiring portion and the end surfaces of the multilayer wiring board can be more reliably reduced. In addition, in a case where the chamfered portions having curved surfaces are formed at the boundary portions between the substrate main surface and the end surfaces of the ceramic wiring substrate, a problem that the ceramic at the above-described boundary portions is chipped can be reliably avoided, and thus, the reliability of the multilayer wiring board for inspection of electronic components is even further improved.

MODES FOR CARRYING OUT THE INVENTION

Hereinafter, one specific embodiment in which the present invention is embodied as a multilayer wiring board will be described in detail with reference to the drawings.

Figure 1:
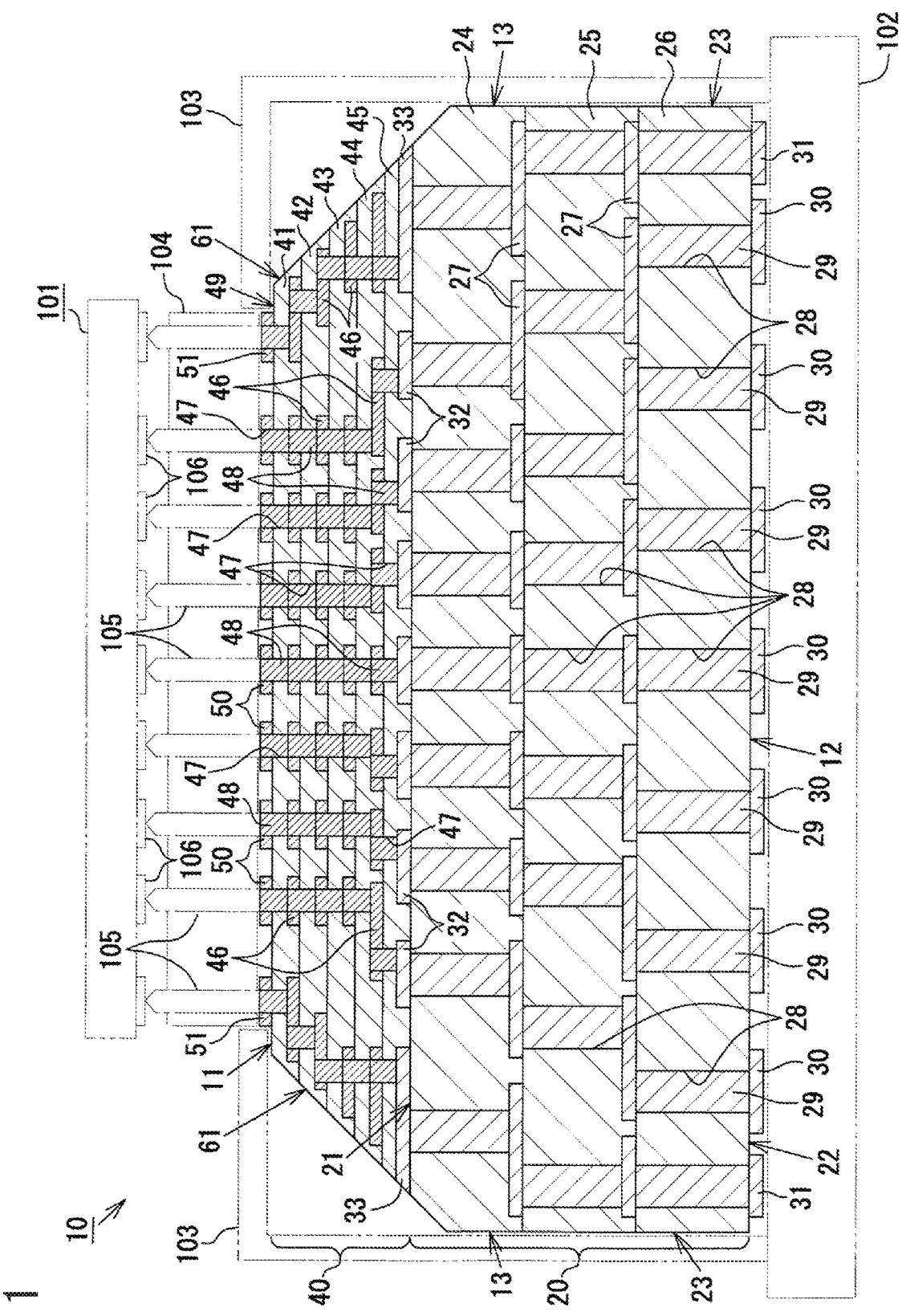
FIG. 1 Schematic cross-sectional view showing a multilayer wiring board according to the present embodiment.

As shown in FIG. 1, a multilayer wiring board 10 according to the present embodiment is a wiring board used for electrical inspection of an IC chip 101 that is an electronic component. The multilayer wiring board 10 includes: a ceramic wiring substrate 20 having a substrate main surface 21 and a substrate rear surface 22; and a resin wiring portion 40 stacked on the substrate main surface 21. The multilayer wiring board 10 is a board having longitudinal and lateral lengths of approximately 100 mm and a thickness of approximately 5 mm. When the multilayer wiring board 10 is used, the multilayer wiring board 10 is arranged such that a main surface 11 (upper surface in FIG. 1) thereof faces an IC chip 101 to be inspected.

The ceramic wiring substrate 20 has a structure in which three ceramic insulation layers 24, 25, 26 and conductive layers 27 are alternately stacked. The ceramic insulation layers 24 to 26 are sintered bodies made from ceramic such as alumina ($Al_2O_3$), and the conductive layers 27 are metalized layers made from, for example, tungsten, molybdenum, or an alloy of those. In the ceramic insulation layers 24 to 26, through holes 28 are formed so as to penetrate therethrough in the thickness direction. In the through holes 28, via conductors 29 are formed so as to be connected to the conductive layers 27. Each of the through holes 28 has a circular cross-sectional shape, and the inner diameter of the through hole 28 is approximately 60 μm. Each of the via conductors 29 also has a circular cross-sectional shape, and the outer diameter of the via conductor 29 is approximately 60 μm. Similarly to the conductive layers 27, the via conductors 29 are formed of metalized layers made from, for example, tungsten, molybdenum, or an alloy of those. The conductive layers 27 and the via conductors 29 have a function to establish electrical communication between the substrate main surface 21 and the substrate rear surface 22. No end surfaces of the conductive layers 27 are exposed from side surfaces 13 of the multilayer wiring board 10.

As shown in FIG. 1, on the substrate rear surface 22 of the ceramic wiring substrate 20 (on a rear surface 12 of the multilayer wiring board 10), a plurality of center-portion-side terminals 30 and a plurality of outer-periphery-portion-side terminals 31 are formed. The center-portion-side terminals 30 are arranged on the center portion side of the substrate rear surface 22, and the outer-periphery-portion-side terminals 31 are arranged on the outer periphery portion side of the substrate rear surface 22. On the substrate main surface 21 of the ceramic wiring substrate 20, a plurality of center-portion-side conductive layers 32 which are substrate-side conductive layers and a plurality of outer-periphery-portion-side conductive layers 33 which are also substrate-side conductive layers, are formed. The center-portion-side conductive layers 32 are arranged on the center portion side of the substrate main surface 21, and the outer-periphery-portion-side conductive layers 33 are arranged on the outer periphery portion side of the substrate main surface 21.

The resin wiring portion 40 is stacked on the substrate main surface 21 so as to cover the center-portion-side conductive layers 32 and the outer-periphery-portion-side conductive layers 33. The resin wiring portion 40 has a structure in which five resin insulation layers 41, 42, 43, 44, 45 and wiring layers 46 are alternately stacked. That is, the resin wiring portion 40 has the wiring layers 46 between the resin insulation layers 41 to 45. In the resin insulation layers 41 to 45, via holes 47 are formed so as to penetrate therethrough in the thickness direction. In the via holes 47, via conductors 48 are formed so as to be connected to the wiring layers 46.

As shown in FIG. 1, the resin insulation layers 41 to 45 are insulation layers made from, for example, a polyimide-based resin. In the present embodiment, each of the resin insulation layers 41 to 45 is made from a polyimide-based thermoplastic resin, and has a thickness of approximately 25

μm. Each of the wiring layers 46 is a conductive layer made from, for example, copper, and has a thickness of approximately 5 μm. The via holes 47 and the via conductors 48 of the resin wiring portion 40 each have a circular cross-sectional shape, and the inner diameters of the via holes 47 and the outer diameters of the via conductors 48 are each approximately 50 μm.

A plurality of inspection pads 50 for inspection of an IC chip are formed in an array at a center portion of the main surface 11 of the multilayer wiring board 10 (of a front surface 49 of the resin wiring portion 40). In addition, a plurality of inspection pads 51 are formed at an outer periphery portion of the main surface 11. The inspection pads 50, 51 each have a circular cross-sectional shape, and the diameters of the inspection pads 50, 51 are each set to approximately, for example, 100 μm.

Figure 2:
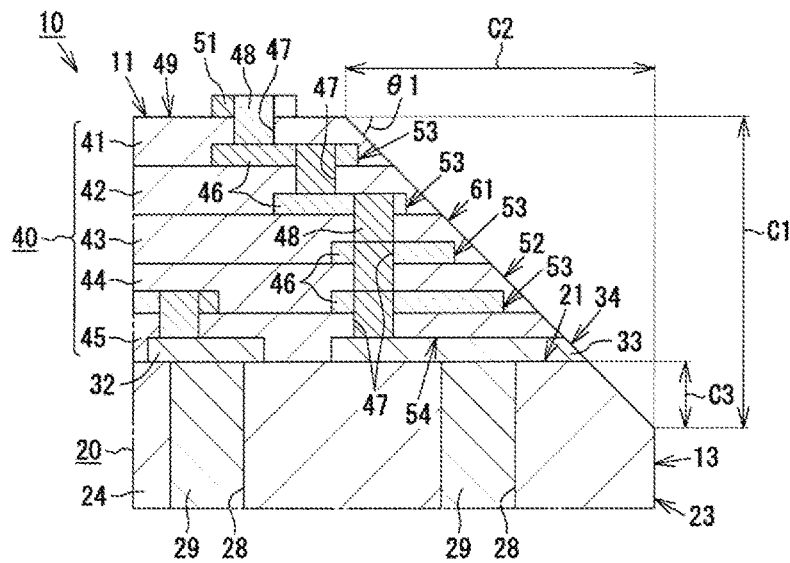
FIG. 2 Cross-sectional view of a major part of the multilayer wiring board.

As shown in FIG. 1 and FIG. 2, the multilayer wiring board 10 has chamfered portions 61 at boundary portions between the front surface 49 of the resin wiring portion 40 (i.e., the main surface 11 of the multilayer wiring board 10) and the side surfaces 13 of the multilayer wiring board 10. The surfaces of the chamfered portions 61 form parts of the side surfaces 13 of the multilayer wiring board 10, and are flat surfaces. A chamfering depth C1 of each of the chamfered portions 61 relative to the front surface 49 of the resin wiring portion 40 is 0.25 mm, and a chamfering depth C2 of the chamfered portion 61 relative to the corresponding one of the side surfaces 13 of the multilayer wiring board 10 is also 0.25 mm, similarly to the chamfering depth C1. Thus, a chamfering angle θ1 of the chamfered portion 61 relative to the front surface 49 of the resin wiring portion 40 is 45°.

From the surfaces of the chamfered portions 61, entireties of end surfaces 52 of the resin wiring portion 40 are exposed. In addition, from the surfaces of the chamfered portions 61, end surfaces 34 of the outer-periphery-portion-side conductive layers 33 are exposed, but no end surfaces 53 of the wiring layers 46 are exposed. The end surfaces 34 of the outer-periphery-portion-side conductive layers 33 are substantially flush with the surfaces of the chamfered portions 61. An outer peripheral edge of a rear surface 54 of the resin wiring portion 40 is in contact with the surfaces of the outer-periphery-portion-side conductive layers 33.

As shown in FIG. 1 and FIG. 2, the chamfered portions 61 are formed also at boundary portions between the substrate main surface 21 and end surfaces 23 of the ceramic wiring substrate 20. Thus, from the surfaces of the chamfered portions 61, the end surfaces 23 of the ceramic wiring substrate 20 are partially exposed. A chamfering depth C3 of each of the chamfered portions 61 relative to the substrate main surface 21 is 0.1 mm. Regions, which form the chamfered portions 61, of the end surfaces 23 of the ceramic wiring substrate 20 are substantially flush with the end surfaces 52 of the resin wiring portion 40 and the end surfaces 34 of the outer-periphery-portion-side conductive layers 33. The end surfaces 52 of the resin wiring portion 40 and the end surfaces 34 of the outer-periphery-portion-side conductive layers 33 are positioned closer to the center of the board than the end surfaces 23 of the ceramic wiring substrate 20.

As shown in FIG. 1, the center-portion-side conductive layers 32 which are arranged at a center portion of the substrate main surface 21 of the ceramic wiring substrate 20 and which are not exposed from the side surfaces 13 of the multilayer wiring board 10, are electrically connected to the inspection pads 50 via the wiring layers 46 and the via conductors 48. In addition, the center-portion-side conductive layers 32 are electrically connected to the center-portion-side terminals 30 via the conductive layers 27 and the via conductors 29. The center-portion-side conductive layers 32 according to the present embodiment are configured as conductors for ground or a power source.

Meanwhile, the outer-periphery-portion-side conductive layers 33 which are arranged at an outer periphery portion of the substrate main surface 21 and which are exposed from the side surfaces 13 of the multilayer wiring board 10, are electrically connected to the inspection pads 51 via the wiring layers 46 and the via conductors 48. In addition, the outer-periphery-portion-side conductive layers 33 are electrically connected to the outer-periphery-portion-side terminals 31 via the conductive layers 27 and the via conductors 29. The outer-periphery-portion-side conductive layers 33 according to the present embodiment are not configured as dummy conductors but as conductors for ground or a power source.

As shown in FIG. 1, at the time of inspection of an IC chip 101, the multilayer wiring board 10 is inserted between a board support 102 and a clamp 103 at first. Subsequently, base ends of a plurality of probes 105 held by a probe head 104 are brought into contact with the inspection pads 50, 51 of the multilayer wiring board 10. In addition, while the probes 105 are electrically connected to a tester (not shown) via the multilayer wiring board 10, leading ends of the probes 105 are brought into contact with surface connection terminals 106 of the IC chip 101. Moreover, power is supplied from the tester in this state so that various signals required for a test are inputted and outputted. As a result, whether or not the IC chip 101 is normal is determined.

Next, a method for manufacturing the multilayer wiring board 10 according to the present embodiment will be described.

Figure 3:
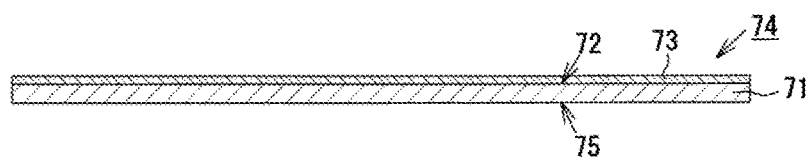
FIG. 3 Explanatory view showing a copper-foil-adhered resin film.

At first, as shown in FIG. 3, a copper-foil-adhered resin film 74 is prepared by forming a copper foil 73, which serves as the wiring layer 46, on a main surface 72 (top surface in FIG. 3) on one side of a resin insulation material 71 which serves as any of the resin insulation layers 41 to 45, and the copper-foil-adhered resin film 74 is cut so as to have a predetermined dimension. The resin insulation material 71 is made from a polyimide-based thermoplastic resin. The copper foil 73 having a thickness of 5 μm is adhered on the main surface 72 side of the resin insulation material 71.

Figure 4:
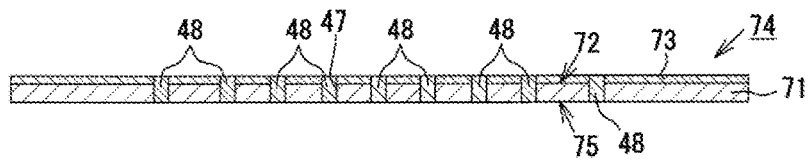
FIG. 4 Explanatory view showing a step for forming via conductors.

Subsequently, via holes 47 are formed by laser processing so as to penetrate the resin insulation material 71 and the copper foil 73 of the copper-foil-adhered resin film 74. Then, the via holes 47 are filled with an electrically conductive paste (copper paste) containing copper powder as a main component with use of a paste printing filling device (not shown) so that the via conductors 48 are formed (refer to FIG. 4). Thereafter, the resultant structure is heated at 150° C. for one hour.

Then, a photosensitive dry film is adhered on the copper foil 73 formed on the main surface 72 of the resin insulation material 71. In addition, a mask for exposure for which a wiring pattern of the inspection pads 50, 51 is formed in advance, is arranged on the dry film. Subsequently, after the dry film is subjected to exposure through the mask for exposure, the resultant structure is subjected to development so that an etching resist for use in etching of the copper foil 73 is formed in the pattern. Moreover, the photosensitive dry film is adhered also on the main surface 75 (bottom surface in FIG. 4) side of the resin insulation material 71, and the resultant structure is subjected to exposure and development as described above so that an etching resist is formed so as to cover an entirety of the main surface 75.

Figure 5:
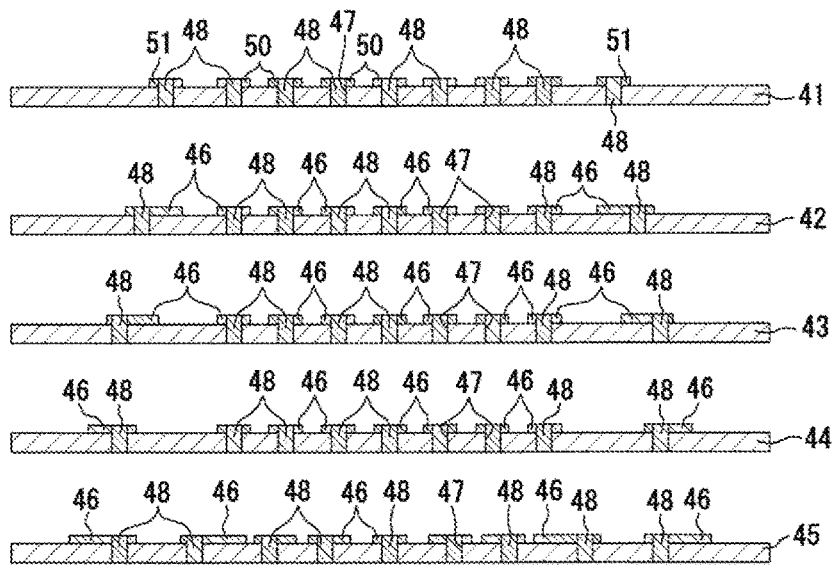
FIG. 5 Explanatory view showing resin insulation layers forming a resin wiring portion.

Thereafter, a portion, of the copper foil 73, which is exposed from the resist pattern in the etching resist is removed by etching so that the inspection pads 50, 51 are formed. Thereafter, the resultant structure is brought into contact with a peeling liquid so that the etching resist remaining on the inspection pads 50, 51 is removed and so that the etching resist on the main surface 75 side is also removed. As a result, as shown in FIG. 5, the resin insulation layer 41 having the inspection pads 50, 51 and the via conductors 48 is formed. Furthermore, by similarly performing the above-described steps, the resin insulation layers 42 to 45 having the wiring layers 46 and the via conductors 48 are formed.

Figure 6:
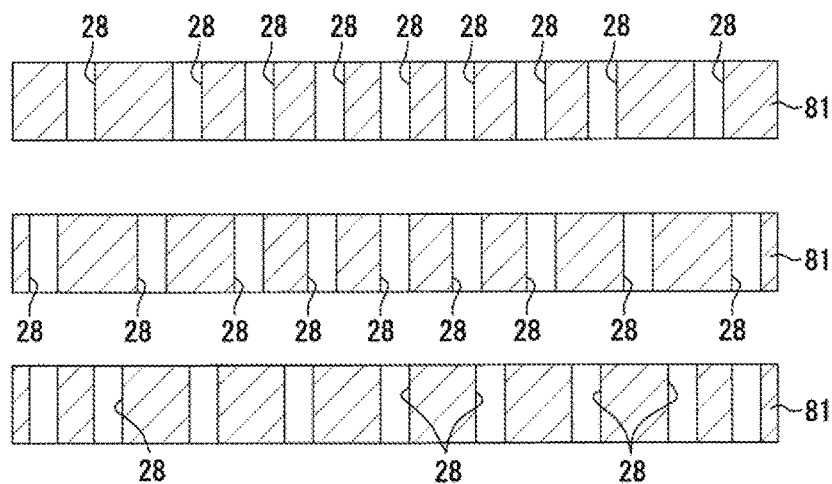
FIG. 6 Explanatory view showing green sheets.

In addition, the ceramic wiring substrate 20 is formed. Specifically, a plurality of green sheets 81 are formed with use of a ceramic material containing alumina powder as a main component (refer to FIG. 6). Then, laser processing is performed on the green sheets 81 so that a plurality of the through holes 28 are formed at predetermined positions. The through holes 28 may be formed by punching, drilling, or the like.

Figure 7:
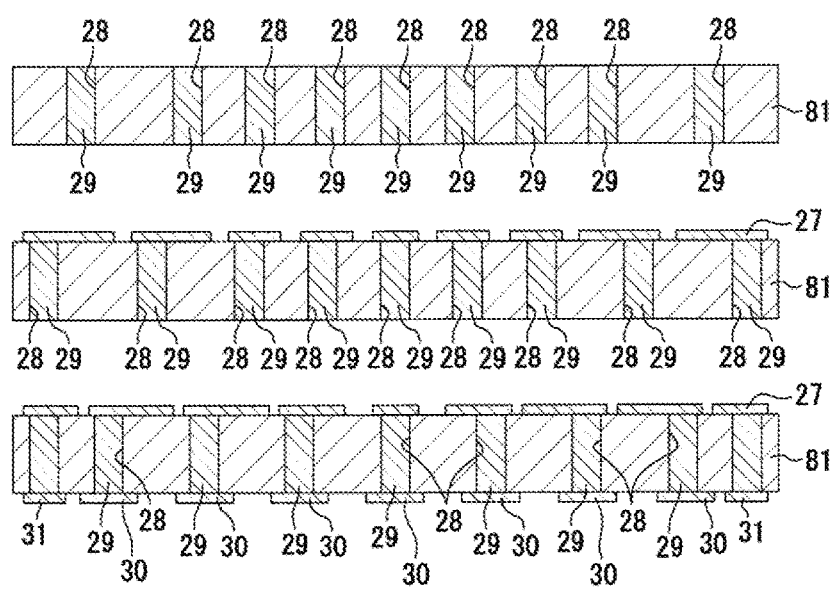
FIG. 7 Explanatory view showing a step for forming unfired via conductors, conductive layers, center-portion-side terminals, and outer-periphery-portion-side terminals.

Thereafter, the through holes 28 of the green sheets 81 are filled with an electrically conductive paste (e.g., tungsten paste) with use of a conventionally known paste printing device (not shown) so that unfired via conductors 29 are formed. The electrically conductive paste is further printed on the resultant structure with use of the paste printing device so that unfired conductive layers 27, unfired center-portion-side terminals 30, and unfired outer-periphery-portion-side terminals 31 are formed (refer to FIG. 7). Filling with the electrically conductive paste and printing thereof may be performed in reverse order.

Figure 8:
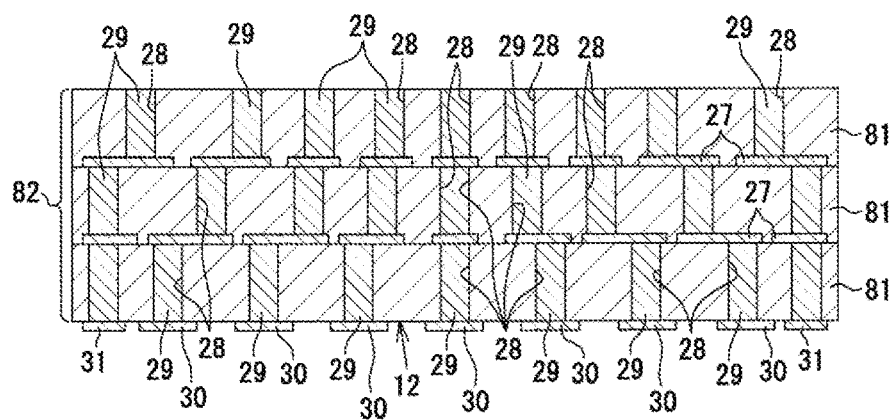
FIG. 8 Explanatory view showing a ceramic stacked body.

After the electrically conductive paste is dried, the plurality of green sheets 81 are arranged so as to be stacked, and pressing force is applied thereto in the sheet stacking direction so that the green sheets 81 are pressure-bonded and integrated with each other, thereby forming a ceramic stacked body 82 (refer to FIG. 8). Subsequently, the ceramic stacked body 82 is degreased and fired at a predetermined temperature for a predetermined time period. As a result, the alumina of the green sheets 81 and tungsten in the paste are sintered at the same time, thereby forming the ceramic wiring substrate 20.

Figure 9:
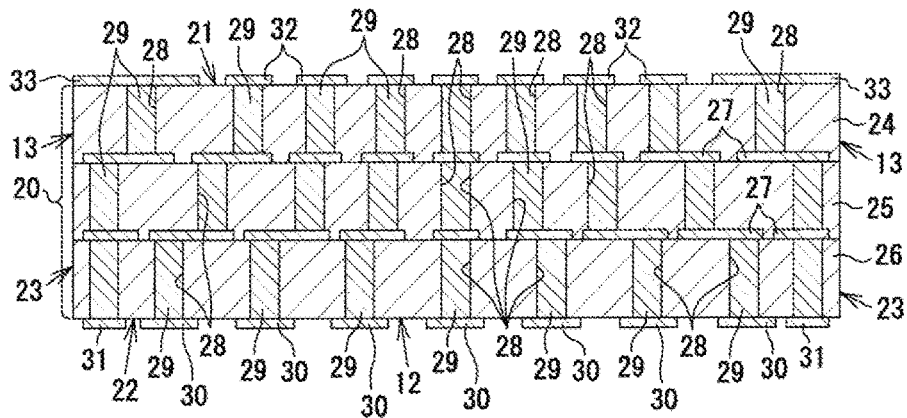
FIG. 9 Explanatory view showing a step for forming center-portion-side conductive layers and outer-periphery-portion-side conductive layers.

Then, the substrate main surface 21 of the ceramic wiring substrate 20 is polished. Subsequently, after a thin film is formed on the substrate main surface 21 through sputtering of titanium and copper, the resultant structure is subjected to exposure and development so that the center-portion-side conductive layers 32 are formed at the center portion of the substrate main surface 21 and so that the outer-periphery-portion-side conductive layers 33 are formed at the outer periphery portion of the substrate main surface 21 (refer to FIG. 9).

Figure 10:
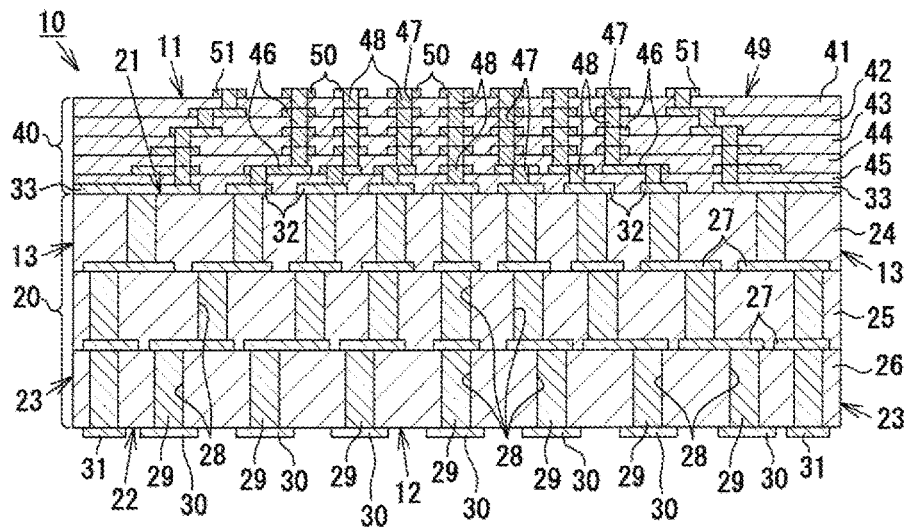
FIG. 10 Explanatory view showing a multilayer wiring board before chamfered portions are formed thereon.

Thereafter, a structure obtained by the resin insulation layers 41 to 45 (refer to FIG. 5) being arranged so as to be stacked on the substrate main surface 21 of the ceramic wiring substrate 20 is pressed at a pressure of approximately 75 kgf/cm² while being heated to a temperature of approximately 350° C. By the heating and the pressing, the resin insulation material 71 of the resin insulation layers 41 to 45 is softened to function as adhesion layers, whereby the resin insulation layers 41 to 45 are collectively pressure-bonded to the ceramic wiring substrate 20. At this time, the multilayer wiring board 10 is formed in which the ceramic wiring substrate 20 and the resin wiring portion 40 are integrated with each other (refer to FIG. 10).

Subsequently, by a polishing machine, the chamfered portions 61 are formed at boundary portions between the front surface 49 of the resin wiring portion 40 and the side surfaces 13 of the multilayer wiring board 10. As a result, the multilayer wiring board 10 having the chamfered portions 61 formed thereon is manufactured. The chamfered portions 61 may be formed by pressing a V-shaped blade or a U-shaped blade against the multilayer wiring board 10. Alternatively, the chamfered portions 61 may be formed by performing laser trimming to remove the resin material at outer periphery portions of the resin wiring portion 40 and the ceramic material at outer periphery portions of the ceramic wiring substrate 20.

Thus, the following effects can be achieved according to the present embodiment.

(1) In the multilayer wiring board 10 for inspection of an IC chip according to the present embodiment, the end surfaces 34 of the outer-periphery-portion-side conductive layers 33 are exposed from the side surfaces 13 of the multilayer wiring board 10, and the outer peripheral edge of the rear surface 54 of the resin wiring portion 40 is in contact with the surfaces of the outer-periphery-portion-side conductive layers 33. Thus, an outer periphery portion of the rear surface 54 of the resin wiring portion 40 is not in direct contact with the ceramic insulation layer 24 of the ceramic wiring substrate 20, but is in contact with the ceramic insulation layer 24 with the outer-periphery-portion-side conductive layers 33 interposed therebetween. In this case, the adhesiveness between the outer-periphery-portion-side conductive layers 33 and the resin insulation layer 45 of the resin wiring portion 40 is ensured, and the adhesiveness between the outer-periphery-portion-side conductive layers 33 and the ceramic insulation layer 24 is ensured. Thus, delamination is less likely to occur between the resin wiring portion 40 and the ceramic wiring substrate 20. Accordingly, the resin wiring portion 40 and the ceramic wiring substrate 20 reliably come to be in close contact with each other, whereby a multilayer wiring board 10 having excellent reliability can be obtained.

(2) The multilayer wiring board 10 according to the present embodiment is held by the clamp 103 at the time of inspection of an IC chip 101. However, since the holding surfaces of the clamp 103 are brought into close contact with the side surfaces 13 of the multilayer wiring board 10, if the end surfaces 34 of the outer-periphery-portion-side conductive layers 33 are exposed from the side surfaces 13 of the multilayer wiring board 10, there is a risk that a malfunction (short-circuiting, etc.) due to a current flowing from the outer-periphery-portion-side conductive layers 33 to the clamp 103 occurs.

Accordingly, in the present embodiment, the chamfered portions 61 are formed at the boundary portions between the front surface 49 of the resin wiring portion 40 and the side surfaces 13 of the multilayer wiring board 10, and the end surfaces 34 of the outer-periphery-portion-side conductive layers 33 are exposed from the surfaces of the chamfered portions 61. With this configuration, since the surfaces of the chamfered portions 61 are spaced apart from the holding surfaces of the clamp 103, even if the end surfaces 34 of the outer-periphery-portion-side conductive layers 33 are exposed from the surfaces of the chamfered portions 61, the outer-periphery-portion-side conductive layers 33 and the clamp 103 are prevented from being electrically connected to each other. In addition, in the present embodiment, the end surfaces 34 of the outer-periphery-portion-side conductive layers 33 are substantially flush with the surfaces of the chamfered portions 61. With this configuration, the end surfaces 34 and the holding surfaces of the clamp 103 are more reliably prevented from coming into contact with each other, and thus, the outer-periphery-portion-side conductive layers 33 and the clamp 103 are more reliably prevented from being electrically connected to each other. Thus, any malfunction due to a current flowing from the outer-periphery-portion-side conductive layers 33 to the clamp 103 can be reliably prevented.

(3) In the present embodiment, a structure obtained by the five resin insulation layers 41 to 45 being arranged so as to be stacked on the substrate main surface 21 of the ceramic wiring substrate 20, is heated and pressed so that the resin insulation layers 41 to 45 are collectively pressure-bonded to the substrate main surface 21. In this case, as compared with a case where the resin insulation layers 41 to 45 are pressure-bonded to the substrate main surface 21 one by one, the manufacturing process can be simplified and the multilayer wiring board 10 can be manufactured within a short period.

The present embodiment may be modified as described below.

Figure 11:
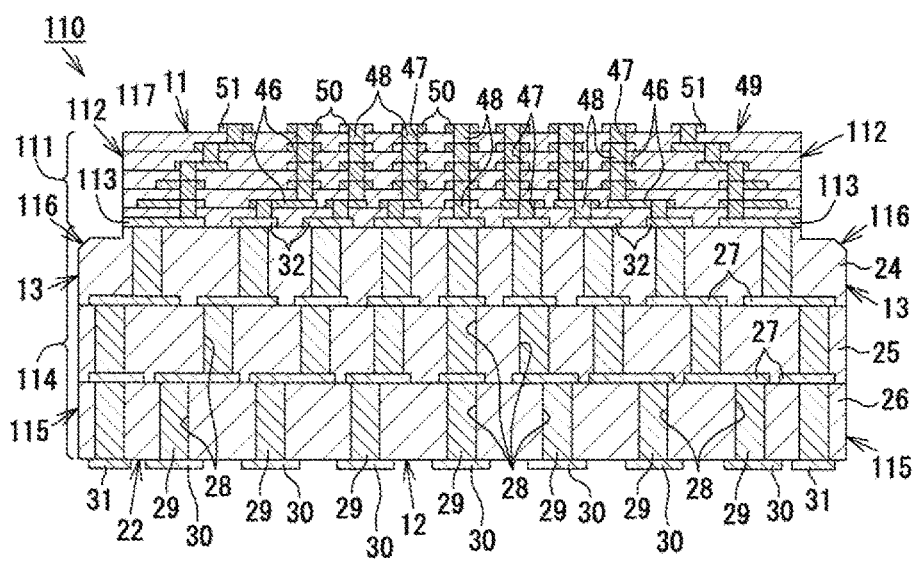
FIG. 11 Schematic cross-sectional view showing a multilayer wiring board according to another embodiment.

The chamfered portions 61 according to the above-described embodiment are formed at the boundary portions between the front surface 49 of the resin wiring portion 40 and the side surfaces 13 of the multilayer wiring board 10, and, in addition, are formed also at the boundary portions between the substrate main surface 21 of the ceramic wiring substrate 20 and the end surfaces 23 of the ceramic wiring substrate 20. However, the chamfered portions may be formed only at the boundary portions between the front surface 49 of the resin wiring portion 40 and the side surfaces 13 of the multilayer wiring board 10. In addition, as shown in a multilayer wiring board 110 in FIG. 11, end surfaces 112 of a resin wiring portion 111 and end surfaces of outer-periphery-portion-side conductive layers 113 (substrate-side conductive layers) may be arranged closer to the center of the board than end surfaces 115 of a ceramic wiring substrate 114, and chamfered portions 116 may be formed only at boundary portions between a substrate main surface 117 of the ceramic wiring substrate 114 and the end surfaces 115 of the ceramic wiring substrate 114. The chamfered portions 116 may not necessarily be formed.

Figure 12:
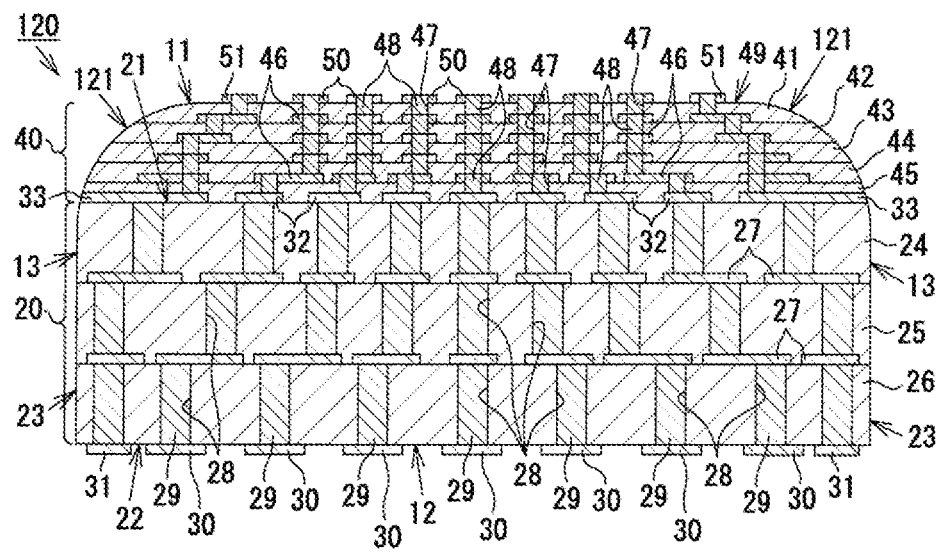
FIG. 12 Schematic cross-sectional view showing a multilayer wiring board according to another embodiment.
Figure 13:
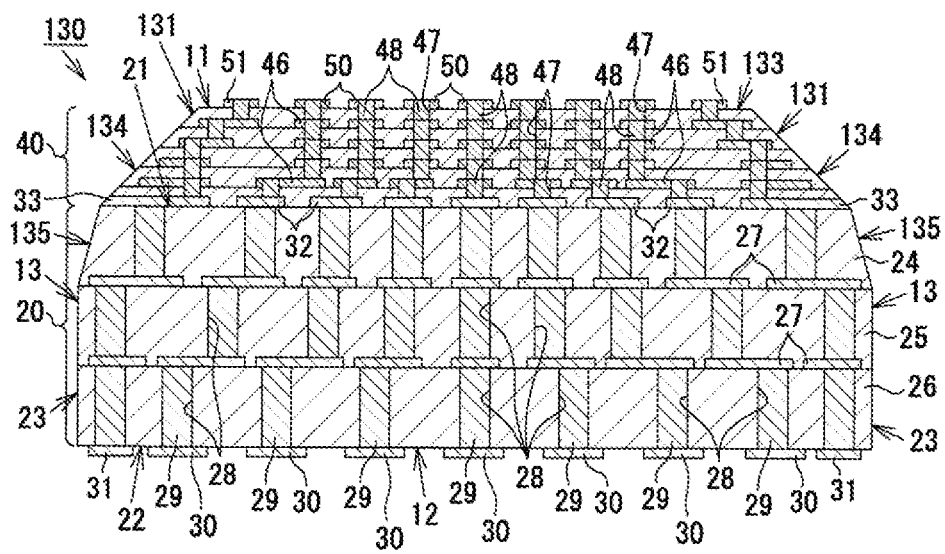
FIG. 13 Schematic cross-sectional view showing a multilayer wiring board according to another embodiment.

The surfaces of the chamfered portions 61 according to the above-described embodiment are flat surfaces. However, as shown in a multilayer wiring board 120 in FIG. 12, the surfaces of chamfered portions 121 may be curved surfaces protruding outward of the multilayer wiring board 120. In a case where the surfaces of the chamfered portions are flat surfaces, the chamfered portions may be each obtained by connecting a plurality of chamfered sections having different chamfering angles. For example, as shown in a multilayer wiring board 130 in FIG. 13, chamfered portions 131 may be each obtained by connecting a first chamfered section 134 having a chamfering angle of 45° relative to a front surface 133 of a resin wiring portion 132 and a second chamfered section 135 having a chamfering angle of 75° relative to the front surface 133 to each other.

In the above-described embodiment, the structure obtained by the five resin insulation layers 41 to 45 being arranged so as to be stacked on the substrate main surface 21 of the ceramic wiring substrate 20 is heated and pressed so that the resin insulation layers 41 to 45 are collectively pressure-bonded to the substrate main surface 21. However, the resin insulation layers 41 to 45 may be pressure-bonded to the substrate main surface 21 one by one. In this case, although the work period for the multilayer wiring board 10 increases, the resin insulation layers 41 to 45 can be reliably prevented from being misaligned when being stacked.

Next, a description will be given of technical ideas that can be understood from the above-described embodiments, other than the technical ideas described in claims.

(1) The multilayer wiring board for inspection of electronic components according to the above-described means 1, wherein the substrate-side conductive layers include the center-portion-side conductive layers arranged at the center portion of the substrate main surface and the outer-periphery-portion-side conductive layers arranged at the outer periphery portion of the substrate main surface, and the outer-periphery-portion-side conductive layers are configured as conductors for ground or a power source.

(2) The multilayer wiring board for inspection of electronic components according to technical idea (1), wherein the outer-periphery-portion-side conductive layers are not dummy conductors.

(3) The multilayer wiring board for inspection of electronic components according to the above-described means 1, wherein the ceramic wiring substrate has a structure in which the plurality of ceramic insulation layers and the plurality of conductive layers are stacked, and the end surfaces of the plurality of conductive layers are not exposed from the side surfaces of the multilayer wiring board.

(4) The multilayer wiring board for inspection of electronic components according to the above-described means 1, wherein the resin insulation layers are insulation layers made from a polyimide-based resin.

(5) The multilayer wiring board for inspection of electronic components according to the above-described means 1, the multilayer wiring board being configured to be used in a state of being sandwiched by a clamp.

DESCRIPTION OF REFERENCE NUMERALS 10, 110, 120, 130: multilayer wiring board
13: side surface of multilayer wiring board
20, 114: ceramic wiring substrate
21, 117: substrate main surface
22: substrate rear surface
23, 115: end surface of ceramic wiring substrate
24, 25, 26: ceramic insulation layer
32: center-portion-side conductive layer as substrate-side conductive layer
33, 113: outer-periphery-portion-side conductive layer as substrate-side conductive layer
34: end surface of substrate-side conductive layer
40, 111, 132: resin wiring portion
41, 42, 43, 44, 45: resin insulation layer
46: wiring layer
49, 133: front surface of resin wiring portion
50, 51: inspection pad
52, 112: end surface of resin wiring portion
53: end surface of wiring layer
54: rear surface of resin wiring portion
61, 121, 131: chamfered portion

What is claimed is:
1. A multilayer wiring board for inspection of electronic components, the multilayer wiring board comprising:
a ceramic wiring substrate having a substrate main surface and a substrate rear surface and having a structure in which a plurality of ceramic insulation layers are stacked;

substrate-side conductive layers formed on the substrate main surface;

a resin wiring portion stacked on the substrate main surface so as to cover the substrate-side conductive layers and having a structure in which a plurality of resin insulation layers are stacked; and a plurality of inspection pads, for inspection of electronic components, formed on a front surface of the resin wiring portion, wherein end surfaces of the substrate-side conductive layers are exposed from side surfaces of the multilayer wiring board, an outer peripheral edge of a rear surface of the resin wiring portion is in contact with surfaces of the substrate-side conductive layers, and end surfaces of the resin wiring portion and the end surfaces of the substrate-side conductive layers are positioned closer to a center of the board than end surfaces of the ceramic wiring substrate.

2. The multilayer wiring board for inspection of electronic components according to claim 1, wherein chamfered portions are formed at boundary portions between the front surface of the resin wiring portion and the side surfaces of the multilayer wiring board, and the end surfaces of the substrate-side conductive layers and entireties of the end surfaces of the resin wiring portion are exposed from surfaces of the chamfered portions.

3. The multilayer wiring board for inspection of electronic components according to claim 2, wherein the chamfered portions are formed also at boundary portions between the substrate main surface and the end surfaces of the ceramic wiring substrate, and parts of the end surfaces of the ceramic wiring substrate are exposed from the surfaces of the chamfered portions.

4. The multilayer wiring board for inspection of electronic components according to claim 2, wherein the surfaces of the chamfered portions and the end surfaces of the substrate-side conductive layers are substantially flush with each other.

5. The multilayer wiring board for inspection of electronic components according to claim 2, wherein the resin wiring portion has wiring layers between the plurality of resin insulation layers, and no end surfaces of the wiring layers are exposed from the surfaces of the chamfered portions.

6. The multilayer wiring board for inspection of electronic components according to claim 2, wherein the surfaces of the chamfered portions are curved surfaces protruding outward of the multilayer wiring board.

7. The multilayer wiring board for inspection of electronic components according to claim 1, wherein the surfaces of the chamfered portions are flat surfaces.

8. The multilayer wiring board for inspection of electronic components according to claim 1, wherein the substrate-side conductive layers exposed from the side surfaces of the multilayer wiring board are electrically connected to the inspection pads.

\* \* \* \* \*